(12) United States Patent
Hou et al.

(10) Patent No.: US 8,001,494 B2
(45) Date of Patent: Aug. 16, 2011

(54) TABLE-BASED DFM FOR ACCURATE POST-LAYOUT ANALYSIS

(75) Inventors: Yung-Chin Hou, Taipei (TW);
Ying-Chou Cheng, Sijhih (TW);
Ru-Gun Liu, Hsinchu (TW);
Chih-Ming Lai, Hsinchu (TW); Yi-Kan Cheng, Taipei (TW); Chung-Kai Lin, Taipei (TW); Hsiao-Shu Chao, Taipei (TW); Ping-Heng Yeh, Tainan County (TW); Min-Hong Wu, Nantou County (TW); Yao-Ching Ku, Hsinchu (TW); Tsong-Hua Ou, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 324 days.

(21) Appl. No.: 12/250,424

(22) Filed: Oct. 13, 2008

(65) Prior Publication Data

US 2010/0095253 A1 Apr. 15, 2010

(51) Int. Cl.
*G06F 17/50* (2006.01)

(52) U.S. Cl. .............. 716/54; 716/55; 716/56; 716/132; 700/121

(58) Field of Classification Search .............. 716/54–56, 716/132; 700/121
See application file for complete search history.

(56) References Cited

U.S. PATENT DOCUMENTS

| | | | |
|---|---|---|---|
| 5,048,800 A | 9/1991 | Miyazaki et al. | |
| 5,440,478 A | 8/1995 | Fisher et al. | |
| 5,822,214 A * | 10/1998 | Rostoker et al. | 716/123 |
| 5,847,965 A | 12/1998 | Cheng | |
| 5,963,881 A | 10/1999 | Kahn et al. | |
| 6,028,991 A | 2/2000 | Akashi | |
| 6,045,619 A | 4/2000 | Tai et al. | |
| 6,077,310 A | 6/2000 | Yamamoto et al. | |
| 6,289,257 B1 | 9/2001 | Sekine | |
| 6,408,219 B2 | 6/2002 | Lamey, Jr. et al. | |
| 6,410,351 B1 | 6/2002 | Bode et al. | |
| 6,549,864 B1 | 4/2003 | Potyrailo | |
| 6,810,296 B2 | 10/2004 | Bode et al. | |
| 6,917,849 B1 | 7/2005 | Pasadyn et al. | |
| 6,931,607 B2 * | 8/2005 | Gunderson et al. | 716/108 |
| 6,968,253 B2 | 11/2005 | Mack et al. | |
| 6,980,873 B2 | 12/2005 | Shen | |
| 7,144,297 B2 | 12/2006 | Lin et al. | |
| 7,360,191 B2 | 4/2008 | Chang et al. | |
| 7,363,207 B2 | 4/2008 | Kamon | |
| 7,562,327 B2 * | 7/2009 | Sekido et al. | 716/55 |
| 7,673,260 B2 * | 3/2010 | Chen et al. | 716/106 |
| 7,743,349 B2 * | 6/2010 | Gupta et al. | 716/136 |
| 2004/0029299 A1 | 2/2004 | Pasadyn et al. | |

(Continued)

OTHER PUBLICATIONS

Chappell, Jeff, "The Future is the FOUP—Company Business and Marketing", Electronic News, Jul. 17, 2000, 2 pages.

(Continued)

*Primary Examiner* — Naum Levin
(74) *Attorney, Agent, or Firm* — Haynes and Boone, LLP

(57) ABSTRACT

Disclosed is a system and method for integrated circuit designs and post layout analysis. The integrated circuit design method includes providing a plurality of IC devices with various design dimensions; collecting electrical performance data of the IC devices; extracting equivalent dimensions of the IC devices; generating a shape related model to relate the equivalent dimensions to the electrical performance data of the IC devices; and creating a data refinement table using the equivalent dimensions and the electrical performance data.

20 Claims, 4 Drawing Sheets

U.S. PATENT DOCUMENTS

| | | |
|---|---|---|
| 2004/0040001 A1 | 2/2004 | Miller et al. |
| 2004/0093107 A1 | 5/2004 | Good et al. |
| 2004/0181299 A1 | 9/2004 | Yamazaki et al. |
| 2005/0007577 A1 | 1/2005 | Engelhard et al. |
| 2005/0008227 A1 | 1/2005 | Duan et al. |
| 2005/0021272 A1 | 1/2005 | Jenkins et al. |
| 2005/0044514 A1 | 2/2005 | Wu et al. |
| 2005/0120328 A1 | 6/2005 | Seltmann et al. |
| 2005/0132306 A1 | 6/2005 | Smith et al. |
| 2005/0188338 A1 | 8/2005 | Kroyan et al. |
| 2005/0209820 A1 | 9/2005 | Inoue et al. |
| 2005/0288812 A1 | 12/2005 | Cheng et al. |
| 2006/0026539 A1 | 2/2006 | Tetelbaum et al. |
| 2006/0048010 A1 | 3/2006 | Tai et al. |
| 2006/0111804 A1 | 5/2006 | Lin |
| 2006/0123380 A1 | 6/2006 | Ikeuchi |
| 2006/0150132 A1* | 7/2006 | Gupta .............................. 716/5 |
| 2006/0190876 A1 | 8/2006 | Yamada |
| 2006/0282189 A1 | 12/2006 | Akisawa et al. |
| 2007/0055892 A1 | 3/2007 | Pikus |
| 2007/0101305 A1 | 5/2007 | Smith et al. |
| 2007/0201442 A1 | 8/2007 | Hekmatpour et al. |
| 2007/0234246 A1 | 10/2007 | Sinha et al. |
| 2007/0265725 A1 | 11/2007 | Liu et al. |
| 2007/0266356 A1 | 11/2007 | Chang et al. |
| 2007/0266362 A1 | 11/2007 | Lai et al. |
| 2007/0277134 A1 | 11/2007 | Zhang et al. |
| 2007/0288219 A1 | 12/2007 | Zafar et al. |
| 2009/0070725 A1 | 3/2009 | Yamada |
| 2009/0083688 A1* | 3/2009 | Moroz et al. ..................... 716/11 |
| 2009/0199151 A1 | 8/2009 | Banerjee et al. |
| 2009/0217216 A1* | 8/2009 | Lee et al. .......................... 716/2 |
| 2009/0222785 A1* | 9/2009 | Cheng et al. ..................... 716/19 |

OTHER PUBLICATIONS

Chen, Kuan-Chou, et al., "Integrated Circuits Industry / Front-Opening Unified Pod Auto-Loading Structure", Knowledge Bridge, No. 22, Apr. 2002, 4 pages.

Ottesen, Craig, "Front-Opening Unified Pod (FOUP) Fire Protection: A General Overview", International Sematech, Nov. 5, 1999, 11 pages.

Tian, Yuxin, et al., "Impact of Photolithography and Mask Variability on Interconnect Parasitics," 10 pages. *Design Automation Conference, 2007.* ASP-DAC '07. Asia and South Pacific.

Zhou, Ying, et al., "A New Methodology for Interconnect Parasitics Extraction Considering Photo-Lithography effects," 6 pages. *Design Automation Conference, 2007.* ASP-DAC '07. Asia and South Pacific.

U.S. Appl. No. 12/025,933, filed Feb. 5, 2008 by Francis Ko, Chih-Wei Lai, Kewei Zuo, Henry Lo, Jean Wang, Ping-hsu Chen, Chun-Hsien Lin, and Chen-Hua yu for "Novel Methodology to Realize Automatic Virtual metrology," 23 pages.

Cheng, Y.C., et al., "Patterning Effect and Correlated Electrical Model of Post-OPC MOSFET Devices," Proceeding of SPIE vol. 6521 65210G-1 to 65210G-9, 9 pages, Mar. 21, 2007.

Ottesen, Craig, "Front Opening Pod (FOUP) Fire Protection: A General Overview," International Sematech, Nov. 5, 1999, 10 pages.

Chen, Kuah-Chou, et al., "Integrated Circuits Industry/Front-Opening Unified Pod Auto-Loading Structure," Knowledge Bridge, No. 22, Apr. 2002, 4 pages.

Chappell, Jeff, "The Future is the FOUP—company Business and Marking," Electronic News, Jul. 17, 2000, 2 pages.

Ouyang, Charles, et al., "An Analytical Model of Multiple ILD thickness Variation induced by Interaction of Layout Pattern and CMP Process," IEEE Transactions on Semiconductor Manufacturing, Aug. 2000, 7 pages.

Raghvendra, Srinivas, et al., "DFM: Linking Design and Manufacturing," Proceedings of the 18th International conference on VLSI Design held jointly with 4th International Conference on Embedded Systems Design, VLSID, 2005, 4 pages.

Tsuijikawa, Hiroyuki, et al., "Power=Supply Noise Reduction with Design for Manufacturability," IEICE Trans Fundamentals, vol. E88-A, No. 12, Dec. 2005, 8 pages.

Yue, H. H., et al., "Fault Detection of Plasma Etchers using Optical Emission Spectra," Aug. 2000, IEEE Transactions on Semiconductor Manufacturing, vol. 13, Issue 3, 12 pages.

Huang, Yi-Ting, et al., "Importance of Data Quality in Virtual metrology," IEEE Industrial Electronics, IECON 2006, 32nd Annual Conference, Nov. 6-10, 2006, 6 pages.

Chang, Yaw-Jen, et al., "Virtual Metrology Technique for Semiconductor Manufacturing," Neural Networks, 2006, IJCNN '06, International Joint conference Jul. 16-21, 2006, 5 pages.

Lin, Tung-Ho, et al., "A Virtual Metrology Scheme for Predicting CVD Thickness in Semiconductor Manufacturing," Robotics and Automation, ICRA Proceedings 2006, IEEE International Conference May 15-19, 2006, 6 pages.

* cited by examiner

TABLE-BASED DFM FOR ACCURATE POST-LAYOUT ANALYSIS

CROSS-REFERENCE

The present disclosure is related to the following commonly-assigned U.S. patent applications, the entire disclosures of which are incorporated herein by reference: U.S. Ser. No. 61/032,358 filed Feb. 28, 2008 by inventors Ying-Chou Cheng et al. for "A METHOD FOR SHAPE AND TIMING EQUIVALENT DIMENSION EXTRACTION"; U.S. Ser. No. 12/025,933 filed Feb. 5, 2008 by inventors Francis Ko et al. for "A NOVEL METHODOLOGY TO REALIZE AUTOMATIC VIRTUAL METROLOGY"; and U.S. Ser. No. 11/748,604 filed May 15, 2007 by inventors Ru-Gun Liu et al. for "MODEL IMPORT FOR ELECTRONIC DESIGN AUTOMATION".

BACKGROUND

Design for manufacturability, or DFM, is an integration of manufacturing data and design procedure for better yield and design efficiency. An interaction and communication between designer and manufacturer is enhanced thereby for more accurate, faster, and more efficient design. The existing DFM layout parasitic extraction (LPE) uses equation-based solutions to predict the device behaviors on chip. The equations are obtained by best fitting to the limited silicon data from the test patterns. The existing design methodology experiences various problems. In one example, the electrical drift effects induced by process variation cannot be separated and accurately predicted by an equation. The resource requirements, either silicon or human, for an equation-based solution poses a fundamental accuracy limitation. The turnaround time and the quality of the equation fitting to silicon are not satisfactory. Furthermore, the equation-based approach cannot handle abrupt/discontinuous layout geometry well without costly high-order approximation and the risk of potential singular point.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

DETAILED DESCRIPTION

Figure 1:
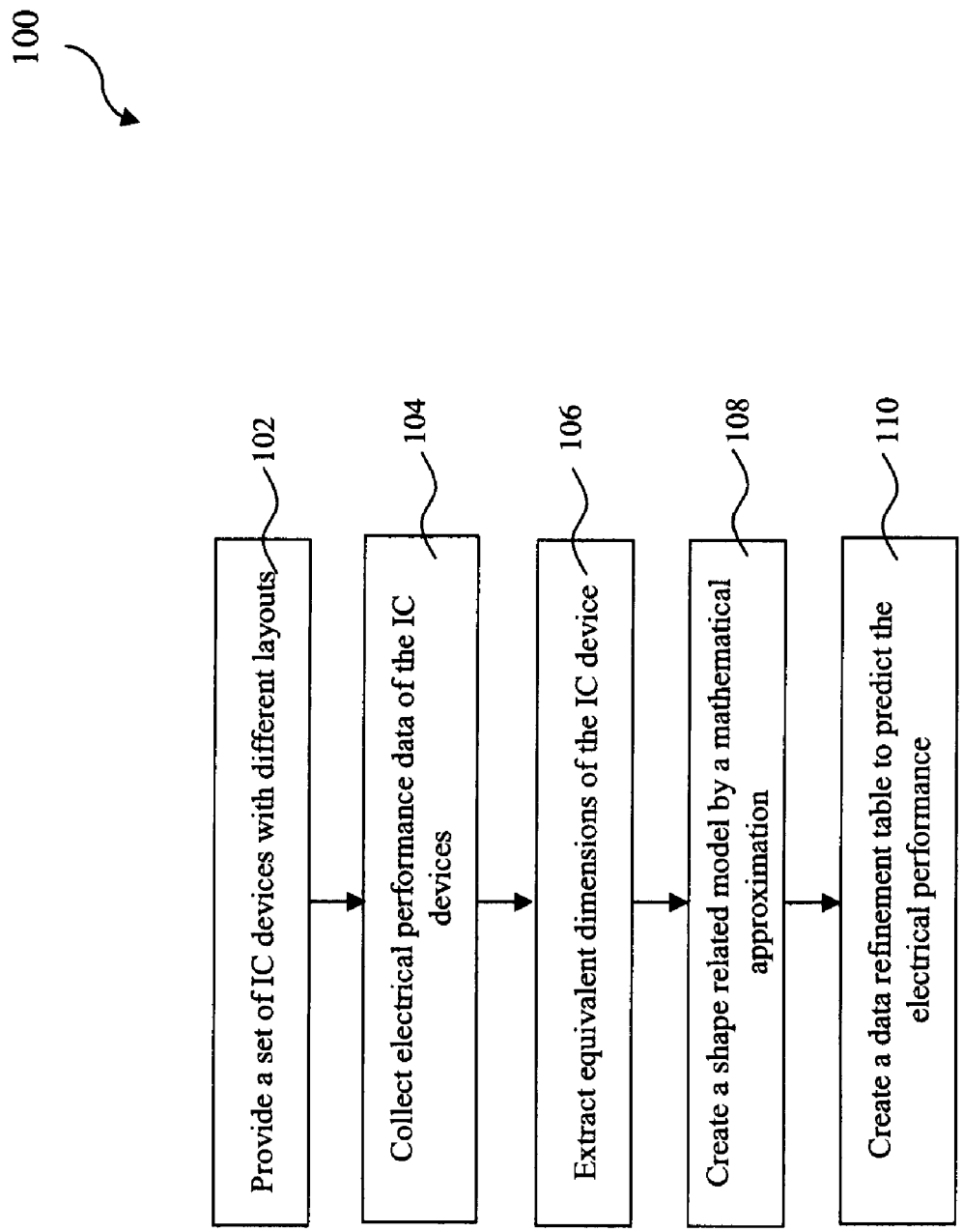
FIG. 1 is a flowchart illustrating a design flow or method according to aspects of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It is understood that in the figures provided, certain elements may be provided out of scale for the sake of clarity. Also, specific embodiments, or examples, are provided to better describe the more general inventive concepts.

Design for manufacturability (DFM) is an integration of manufacturing data and design procedure for better yield and design efficiency. An interaction and communication between designer and manufacturer is enhanced thereby for more accurate, faster, and efficient design. In one example, various manufacturing data are formulated, quantified, and integrated to enable collaboration between manufacturer and designer, reduce design time and design cost, and increase manufacturing yield and production performance.

In order to obtain more accurate prediction on circuits, the disclosed method in various embodiments provides an efficient approach to estimate nonrectangular metal-oxide-semiconductor field-effect transistor (MOSFET) devices using a table-based approach. The method provides a post-layout design analysis to investigate the manufacturability of devices during patterning processes, resulting in improved IC design. In one or more design stages, a simulation tool, such as simulated program with integrated circuit emphasis (SPICE), is used to simulate electrical performances of a designed device based on the design layout of the device. As the real contour of the design layout has distorted areas, such as rounding corners, the disclosed method using the table-based strategy provides a cost-effective and more accurate approach. Particularly, the discontinuous changes of shape-to-electrical behavior can be effectively and accurately analyzed with the disclosed method.

Figure 3:
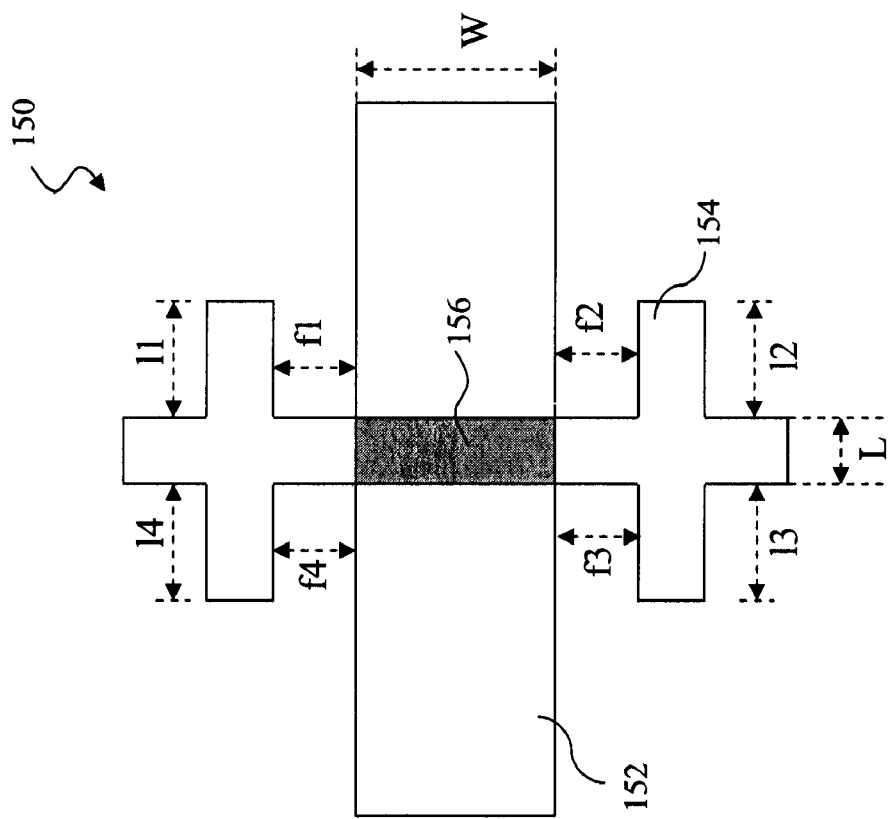
FIG. 3 is a top view of an embodiment of an IC device constructed according to aspects of the present disclosure.
Figure 2:
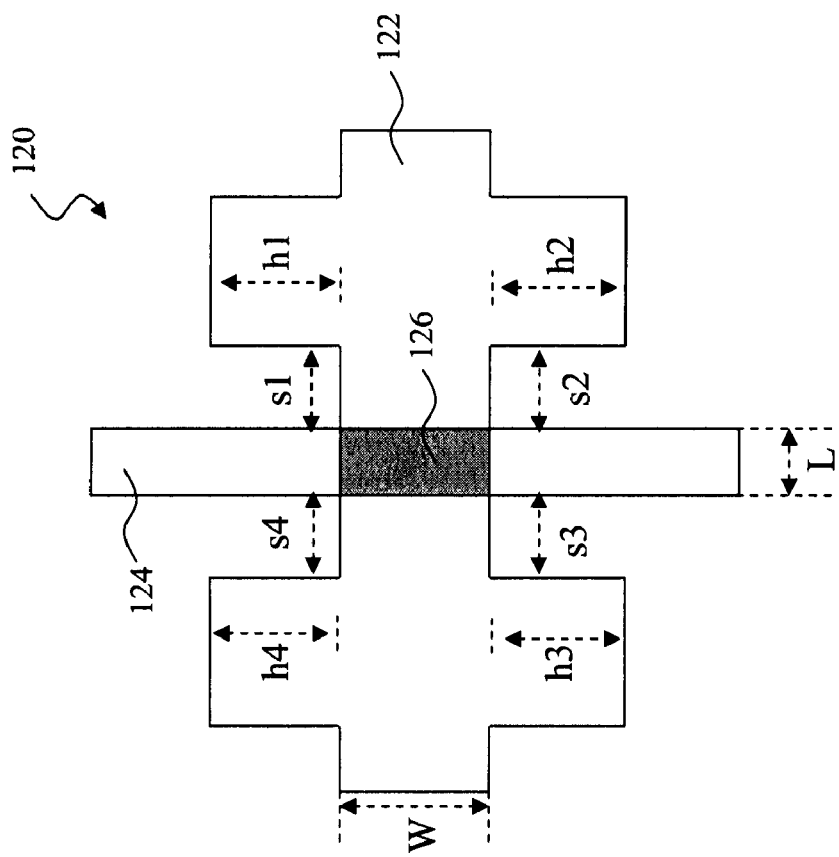
FIG. 2 is a top view of an embodiment of an IC device constructed according to aspects of the present disclosure.

FIG. 1 is a flowchart of an IC design flow or design method 100. FIG. 2 is a top view of an exemplary IC device 120 constructed according to a design layout. FIG. 3 is a top view of an exemplary IC device 150 according to a design layout in another embodiment. Referring to FIGS. 1 through 3, the method 100 is described below in various embodiments.

The method 100 begins at step 102 by providing a set of IC devices with different design layouts. The IC device 120 in FIG. 2 is taken as an example for simplicity to illustrate the design method. In one example, the IC device 120 includes a MOSFET device (or a MOS transistor). The IC device 120 and its layout in various perspectives is illustrated in FIG. 2. In this example, the IC device 120 includes an active region 122 and a gate electrode region 124. The IC device 120 also includes a channel region 126 defined in the overlapping region between the active region 122 and the gate electrode 124. The IC device may also include other features such as sources, drains, and contacts (not shown). The IC design layout may further include other assistant features, such as dummy features and/or optical proximity correction (OPC) features. In this example, as illustrated in FIG. 2, the active region 122 includes various additional areas, referred to as an H-shaped active region since the active region looks similar to the letter "H" in shape. The real manufactured contour of the H-shaped active region will include various rounding corners, referred to as active region rounding. A regular MOS device can be described by a width "W" of the active region and a length "L" of the gate electrode. In addition to the parameters of "W" and "L", the device 120 with the rounding active region can be further described by various heights "h1", "h2", "h3", and "h4" and various spaces "s1", "s2", "s3", and "s4" as illustrated in FIG. 2. For example, "hi" represents the height of an additional feature added to one end and one side of the regular active region. In another example, "s3" represents the space between the gate and another additional feature added to the opposite end and opposite side of the regular active region. The various height parameters may have different values. Similarly, the various space parameters of the IC device may have different values. Therefore, the height and space parameters described above can be used to describe the design layout of the device 120.

In another embodiment, an IC device 150 can include a rounded gate electrode as illustrated in FIG. 3. The IC device 150 in FIG. 3 is also taken as an example for simplicity to illustrate the design method. In this example, the IC device 150 includes a MOSFET device. The IC device 150 and its layout in various perspectives is illustrated in FIG. 3. The IC device 150 includes an active region 152 and a gate electrode region 154. The IC device 150 also includes a channel region 156 defined by an overlapping region between the active region 152 and the gate electrode 154. The IC device 150 may also include other features such as sources, drains, and contacts (not shown). The IC layout may further include other assistant features, such as dummy features and/or OPC features. In this example, as illustrated in FIG. 3, the gate electrode 154 includes various additional areas. The gate electrode is referred to as an I-shaped gate electrode since it looks similar to the letter "I" in shape. The real manufactured contour of the I-shaped gate electrode will include various rounding corners, referred to as gate electrode rounding. In addition to the parameters of "W" and "L" for a regular device, the device 150 with the rounding gate electrode can be further described by various lengths "l1", "l2", "l3", and "l4" and various spaces "f1", "f2", "f3", and "f4" as illustrated in FIG. 3. For example, "l2" represents the length of an additional feature added to one end and one side of the regular gate electrode. In another example, "f4" represents the space between the active region and another additional feature added to the opposite end and opposite side of the regular gate electrode. The various length parameters of the IC device may have different values. Similarly, the various space parameters of the IC device may have different values as well. Therefore, the length and space parameters described above are used to describe the device 150.

In a more generic case, both the active region and the gate electrode may include additional features such that the geometry and the electrical performances of the IC device can be properly described and determined by two sets of the dimensional parameters. The first set includes h1-h4 and s1-s4 used to describe a rounding active region. The other set includes l1-l4 and f1-f4 used to describe a rounding gate electrode.

At this step, a set of IC devices are designed, each with a different layout, particularly, with different dimensional parameters. The set of IC devices with different layouts are chosen properly, considering ranges of the parameters. For example, layouts of the IC devices may cover the range of s parameters from 40 nm to 220 nm. The number of the IC devices is determined with a tradeoff between the accuracy of the data refinement table and the cost to build that table. In one example, 25 IC devices of a given W and L but with different h and s may be designed, manufactured, and used for the IC devices with a rounding active region, similar to the IC device illustrated in FIG. 2. In another example, 25 IC devices of a given W and L but with different l and f may be designed, manufactured, and used for the IC devices with a rounding gate electrode, similar to the IC device illustrated in FIG. 3.

The IC design method 100 proceeds to step 104 by collecting silicon data of the IC devices designed and manufactured at step 102. These IC devices are measured to collect silicon data such as wafer acceptance test (WAT) data. The silicon data includes the values of various electrical parameters. For example, the various electrical parameters include saturation current (Isat), leakage current (Ioff), and threshold voltage (Vts). Therefore, electrical performance data is collected for the IC devices by implementing WAT tests or other proper tests/measurements and used for generating a data refinement table constructed according to aspects of the present disclosure.

The method 100 proceeds to step 106 by extracting equivalent dimensions of the IC devices. The method to generate the equivalent dimensions for each one of the IC devices is disclosed in the cross-referenced application U.S. Ser. No. 61/032,358 titled "A METHOD FOR SHAPE AND TIMING EQUIVALENT DIMENSION EXTRACTION" and assigned to the same assignee. It is briefly described below. First, an IC contour is generated based on the IC design layout. In this description, the layout or design layout of the IC device represents a designed pattern for a photomask intended to be transferred to a wafer during a lithography process. A contour of the IC device represents a pattern transferred to a wafer or a virtual pattern on the wafer by simulation. Here, generating the contour is a process to simulate the IC device to generate its physical dimensions and geometries based on its design layout. The generating process further utilizes the manufacturing data associated with an IC manufacturer to be implemented to fabricate the IC device. In one embodiment, the manufacturing data includes lithography processing data, such as statistical data of focus and/or energy (or dose) and masks associated with lithography exposure, to transfer an IC design layout (such as a channel region 122) defined in the mask to an IC feature on a wafer. The simulation will generate virtual fabricated features corresponding to the IC design layout. In the example of FIG. 2, the real channel region is defined by the gate electrode region and the active region. If the simulation generates an active region contour and a gate electrode contour, the overlapping area of the active region contour and the gate electrode contour defines the channel contour.

Then, an effective rectangle from the IC layout contour is generated. The effective rectangle is a geometry that can be simulated for the electrical performance easily and more efficiently by a SPICE tool or other suitable simulation tool.

The generating of the effective rectangle is explained in detail. First, find a maximum rectangle inside the IC layout contour defined by the gate electrode contour and the active region contour. Then, find a width correction to the maximum rectangle according to the difference between the channel contour and the maximum rectangle. Similarly, find a length correction to the maximum rectangle according to the difference between the channel contour and the maximum rectangle. In one embodiment, the equivalent width of the channel is the width of the maximum rectangle plus the width correction, and the equivalent length is the length of the maximum rectangle plus the length correction.

The method 100 proceeds to step 108 by generating a shape related model. The shape related model relates the dimensional parameters to the electrical performance parameters of the IC device. According to the present disclosure, the shape related model includes the equivalent width "We" or the equivalent length "Le" of the channel instead of the design width W or design length L. For example, the saturation current Isat,hmos for the IC device with a rounding active region may be expressed as a function of We, Le, h1-h4, and s1-s4. Take the difference between the design width W and the equivalent width We as the width change, referred to as dW. Then, the Isat,hmos is further expressed as a function of W, h1-h4, s1-s4, and dW, such as $$Isat,hmos = Isat\ [W, (h, s)_4, dW].$$

Note, the saturation current is not only expressed as a function of the dimensional parameters of the design layout but also as a function of the equivalent dimensions having the rounding effect. Similarly, the leakage current can also be expressed:

$$Ioff,hmos = Ioff\ [W, (h, s)_4, dW],$$

and the threshold voltage can also be expressed:

$$Vts,hmos = Vts[W, (h, s)_4, dW].$$

In another example, the saturation current Isat,imos for the IC device with a rounding gate electrode may be expressed as a function of We, Le, l1-l4, and f1-f4. Take the difference between the design length L and the equivalent length Le as the length change, referred to as dL. Then, the Isat,imos is expressed as a function of L, l1-l4, f1-f4, and dL, such as $$Isat,imos = Isat\ [L, (l, f)_4, dL].$$

Note, the saturation current is not only expressed as a function of the dimensional parameters of the design layout but also as a function of the equivalent dimensions with the rounding effect. Similarly, the leakage current can also be expressed:

$$Ioff,imos = Ioff\ [L, (l, f)_4, dL],$$

and the threshold voltage can also be expressed:

$$Vts,imos = Vts\ [W, (l, f)_4, dL].$$

Figure 4:
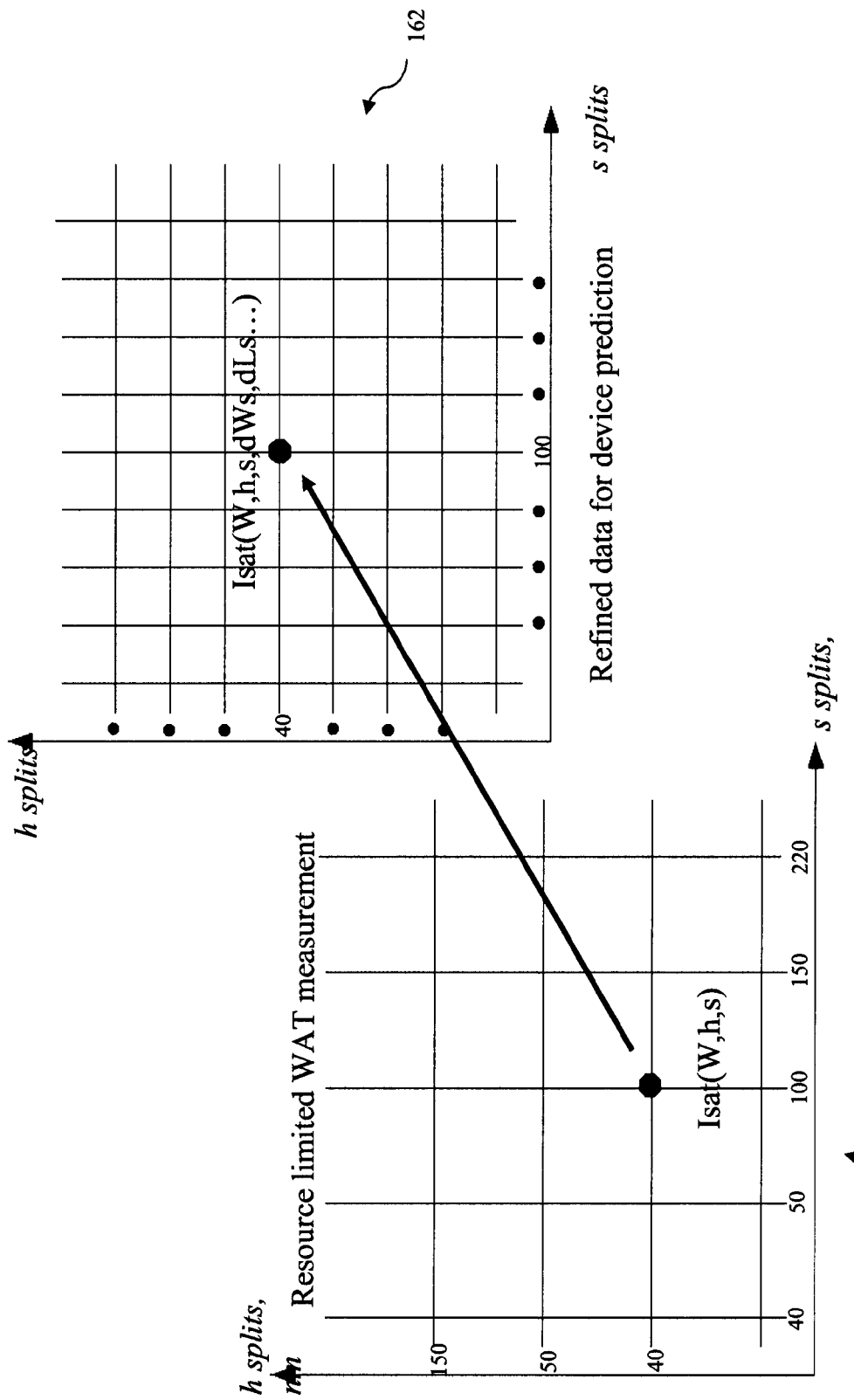
FIG. 4 is a table constructed during a design flow or method according to aspects of the present disclosure.

In furtherance of step 108, as illustrated in the right table 164 of FIG. 4, the shape related model is not only expressed as a function of the dimensional parameters of the design layout but also as a function of the equivalent dimensions having the rounding effect.

The shape related model as described above in various embodiments can be generated using a mathematical approximation method. In one embodiment, the shape related model is generated by multiple regression. In another embodiment, the shape related model is generated by a linear quadratic method. In another embodiment, the shape related model is generated by the response surface approximation. Considering the saturation current of an IC device with a rounding active region, the generic shape related model is Isat,hmos=Isat [W, (h, s)$_4$, dW]. In a simple example for illustration, the saturation current can be expressed as Isat, hmos=Isat+dIsat, where dIsat=$S_1$*dW. So, the saturation current has a saturation current change dIsat from the saturation current Isat with the same layout and without rounding effect. $S_1$ is a coefficient and referred to as a sensitivity. In another example, the leakage current has a leakage current change dIoff from the leakage current Ioff with the same layout and without rounding effect. So, the leakage current can be expressed as Ioffhmos=Ioff+dIoff, where dIoff=$S_2$*dW, wherein the active region has a rounding effect. $S_2$ is a coefficient and referred to as a second sensitivity. In another example, for the IC device having an "I" shaped gate electrode and the rounding effect of the gate electrode, the saturation current can be expressed as Isat,imos=Isat+dIsat, where dIsat=$S_3$*dW. So, the saturation current has a saturation current change dIsat from the saturation current Isat with the same layout and without rounding effect. $S_3$ is a coefficient and referred to as a third sensitivity. Similarly, other sensitivity parameters can be defined in the shape related model.

The method 100 proceeds to step 110 by generating a data refinement table. According to aspects of the present disclosure, the method 100 implements a data refinement table to achieve electrical performance analysis with high accuracy and efficiency. The data refinement table is generated using the collected data and further based on the defined dimensional parameters and the shape related model. The data refinement table includes electrical performance data associated with various layouts and collected from the WAT measurements of the set of the IC devices at step 104. In one example, the data refinement table includes the saturation current collected from the IC devices with different h and s of the active region. In another example, the data refinement table includes the leakage current collected from the IC devices with different h and s of the active region. In another example, the data refinement table includes the saturation current, leakage current, and the threshold voltage. In another embodiment, the data refinement table includes the coefficients in the shape related model such as in Isat,hmos=Isat [W, (h, s)$_4$, dW]. These coefficients are different for each particular layout and thus the table-based method provides high accuracy. As a further example, the data refinement table includes various sensitivity parameters, such as $S_1$, $S_2$, and $S_3$.

The data refinement table is thus defined in multiple dimensions. In one embodiment for the IC device with the rounding active region, the data refinement table has four dimensions including channel length L, channel width W, active region height h, and active space s. In another embodiment, the data refinement table has more dimensions including channel length L, channel width W, active region heights h1-h4, and active spaces s1-s4. In another embodiment, the data refinement table only includes a subset of the above defined dimensions when possible in special situations. The data in the table usually includes various parameters, such as saturation current, leakage current, and threshold voltage. In another example, the various parameters include various coefficients or various sensitivities. Furthermore, when the data refinement table is generated, it is not only based on the designed width and length of the channel. The data are distributed into the table according to the equivalent length Le and equivalent width We of the channel.

Figure 5:
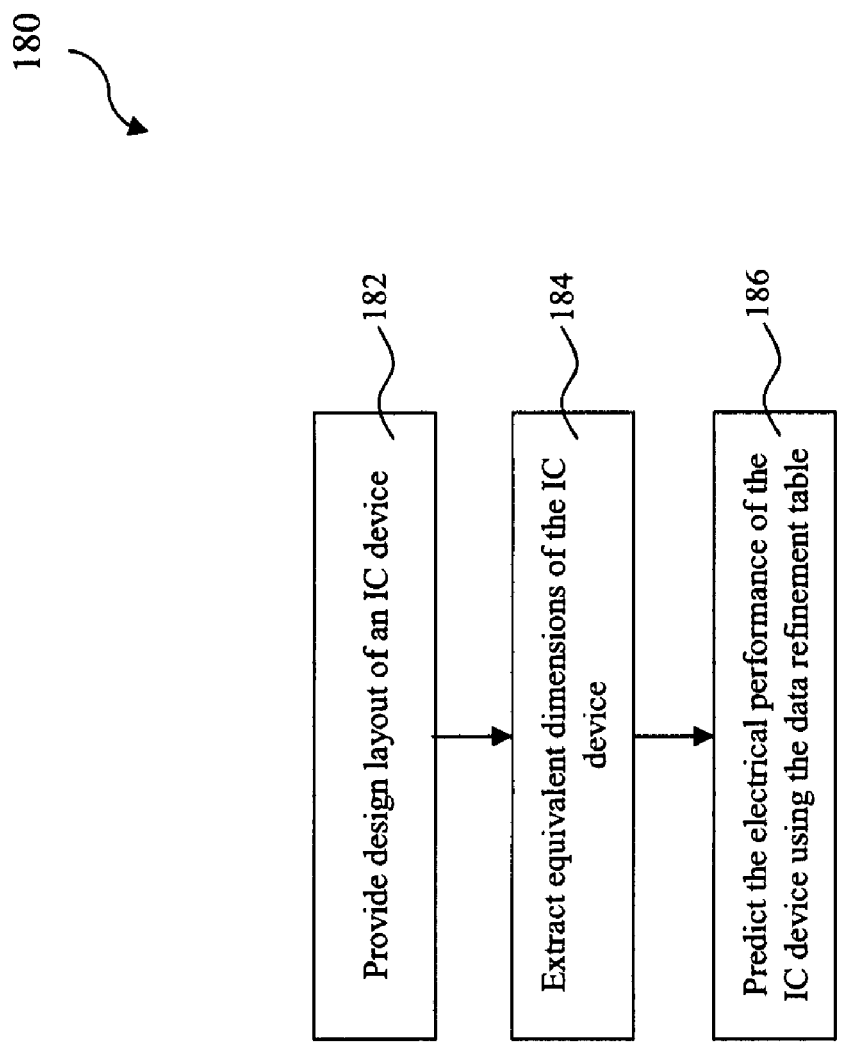
FIG. 5 is a flowchart illustrating a design flow or method according to aspects of the present disclosure.

The data refinement table and the shape related model can provide an approach to accurately and efficiently predict the electrical performance of an IC device based on its design layout. This method is further described below with reference to FIG. 5, including a flowchart of the method 180 to predict the electrical performance of an IC device using the data refinement table. The method 180 can be used for post layout analysis including tuning the design layout and identifying the hot spots. The method begins at step 182 by providing a design layout of an IC device. Take the IC device 120 illustrated in FIG. 2 as an example to illustrate the disclosed method. The provided design layout of the IC device includes the active region with additional features such as OPC features. Therefore, the contour of the channel 126 will be impacted by the rounding effect.

The method 180 proceeds to step 184 by extracting the equivalent dimensions of the IC device. The equivalent dimensions include the equivalent channel width We and the equivalent channel length Le. The extraction of the equivalent dimensions at this step is similar to the step 106 of the method 100. The extraction of the equivalent dimensions includes generating the contour of the channel region 126 and calculating equivalent dimensions of the IC device, which are described below, respectively.

The contour of the IC device is generated by a simulation tool to simulate the wafer fabrication associated with an IC manufacturer to be implemented to fabricate the IC device. The simulation will generate virtual fabricated features corresponding to the IC design layout. In the example of FIG. 2, the contour of the channel region is defined by the contour of the gate electrode region and the contour of the active region. The overlapping region between the active region contour and the gate electrode contour defines the contour of the channel region.

Then, an effective rectangle from the IC layout contour is generated. The effective rectangle is a geometry that can be simulated for the electrical performance easily and more efficiently by a SPICE tool or other suitable simulation tool. To generate the effective rectangle, first find a maximum rectangle inside the IC layout contour defined by the gate electrode contour and the active region contour. Then, find a width correction to the maximum rectangle according to the difference between the channel contour and the maximum rectangle. Similarly, find a length correction to the maximum rectangle according to the difference between the channel contour and the maximum rectangle. In one embodiment, the equivalent width of the channel is the width of the maximum rectangle plus the width correction, and the equivalent length is the length of the maximum rectangle plus the length correction.

The method 180 proceeds to step 186 by predicting the electrical performance of the IC device using the data refinement table. Based on the equivalent width We, equivalent length Le, and other dimensional parameters, such as h and s, the relevant coefficients can be found or extracted from the data refinement table. The proper values of the data refinement table are from the element being closest to the dimensional parameters of the IC device in terms of equivalent width We and equivalent length Le. The difference between the equivalent width of the design layout and the equivalent width for the element of the data refinement table can be labeled as dWe. The electrical performance of the IC device can be predicted using the shape related model with coefficients from the data refinement table. In one particular example, the sensitivity parameters are extracted from the data refinement table. The saturation current change dIsat (or other electrical changes), due to the rounding effect of the active region, can be found by $S_1 *dW$, wherein the dW is the relative difference of the equivalent width defined above. If the length of the channel has a rounding effect, a similar method can be used to find the $S_2$ and dL. Then, the saturation current change due to the rounding effect of the gate electrode can be found by $S_2*dL$. The above embodiment of the method 180 only serves as an example illustrating the method, instead of limiting thereof. The method can also be used to predict leakage current, threshold voltage, and other electrical parameters. The disclosed method 180 is applicable to perform the post-layout analysis for design tuning and other benefits.

The disclosed method 180 can be implemented in an environment including a computer system having a microprocessor, an input device, a storage device, a display, and a communication device all interconnected by one or more buses. The DFM system to implement the disclosed methods for post-layout analysis includes a DFM data kit having manufacturing data from an IC manufacturer, such as lithography processing data and etching data. The DFM system includes a simulation module to generate a contour of an IC device using a design layout of the IC device and the manufacturing data. The DFM system includes a shape related model having shape-to-electrical parameters and associating electrical performance to equivalent dimensions of the IC device. The DFM system also includes a data refinement table having multiple values of the shape-to-electrical parameters corresponding to various design dimensions of the IC device. The DFM system further includes a layout analysis module to extract electrical performance based on the design layout using the data refinement table and the shape related model. The manufacturing data includes lithography processing data, etching data, chemical mechanical polishing data, and combinations thereof. The simulation module includes a lithography process control (LPC) to simulate lithography processes. The shape related model includes an electrical parameter represented as a function of equivalent dimensions of the IC device.

Thus, the present disclosure provides an integrated circuit (IC) design method. The method includes providing a plurality of IC devices with various design dimensions; collecting electrical performance data of the IC devices; extracting equivalent dimensions of the IC devices; generating a shape related model to relate the equivalent dimensions to the electrical performance data of the IC devices; and creating a data refinement table using the equivalent dimensions and the electrical performance data.

The disclosed method may further include predicting electrical performance of a device using the data refinement table and equivalent dimensions of the device. The extracting of the equivalent dimensions may include generating contours of a channel region for one of the IC devices; and calculating equivalent length and width of the channel region of the corresponding IC device. The generating contours may include using a shape simulation tool. The generating of the shape related model may include measuring electrical performance parameters of the IC device. The generating of the shape related model may include calculating electrical performance parameters of the IC devices using the equivalent dimensions of the IC devices. The generating of the shape related model may include using one method selected from the group consisting of multiple regression, linear quadratic modeling, and response surface approximation. The creating of the data refinement table may include finding sensitivity parameters of the electrical performance relative to the equivalent dimensions for said each of the IC devices. The finding the sensitivity coefficients may include finding a width sensitivity of an electrical parameter for said each of the IC devices; and finding a length sensitivity of the electrical parameter for said each of the IC devices. The electrical parameter may include a parameter selected from the group consisting of saturation current, leakage current, and threshold voltage.

The present disclosure also provides an integrated circuit (IC) design method for post-layout analysis to an IC device. The method includes providing a design layout of the IC device; extracting equivalent dimensions of the IC device based on the design layout; and calculating electrical performance parameters of the device using a data refinement table and the equivalent dimensions.

In this method, the extracting of the equivalent dimensions may include generating an IC contour based on the design layout by shape simulation; and calculating equivalent dimensions from the IC contour. The generating of the IC contour may include generating a channel region of the IC device. The calculating of the equivalent dimensions may include finding an equivalent rectangle to represent an overlapping region of an active region and a gate electrode of the IC device; and extracting equivalent width and length of the equivalent rectangle. The calculating of the electrical performance parameters may further include using a shape related model. The data refinement table may include various electrical parameters associated with the shape related model.

The present disclosure also provides a design for manufacturing (DFM) system for post layout analysis. The DFM system includes a DFM data kit including manufacturing data from an IC manufacturer; a simulation module to generate a contour of an IC device using a design layout of the IC device and the manufacturing data; a shape related model associating electrical performance to equivalent dimensions of the IC device; a data refinement table configured to include electrical parameters corresponding to various design layouts; and a layout analysis module to extract electrical performance using the data refinement table and the shape related model.

In the disclosed DFM system, the manufacturing data may include a set of data selected from the group consisting of lithography process data, etching data, chemical mechanical polishing data, and combinations thereof. The simulation module includes a lithography process control (LPC) employing the manufacturing data to simulate lithography processes. The shape related model may include an electrical parameter represented as a function of an equivalent dimension of the IC device.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments disclosed herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit (IC) design method for post-layout analysis to an IC device, the method comprising:
   providing a computer system having a microprocessor, wherein the computer system receives instructions that when executed, carry out:
   receiving a design layout of a IC device;
   extracting equivalent dimensions of the IC device based on the design layout;
   calculating electrical performance parameters of the IC device using a data refinement table and the equivalent dimensions; and
   tuning the design layout of the IC device corresponding to the calculated electrical performance parameters of the IC device.

2. The method of claim 1, wherein the extracting of the equivalent dimensions comprises:
   generating an IC contour based on the design layout by shape simulation; and
   calculating equivalent dimensions from the IC contour.

3. The method of claim 2, wherein the generating of the IC contour comprises generating a channel region of the IC device.

4. The method of claim 2, wherein the calculating of the equivalent dimensions comprises:
   finding an equivalent rectangle to represent an overlapping region of an active region and a gate electrode of the IC device; and
   extracting equivalent width and length of the equivalent rectangle.

5. The method of claim 1, wherein the calculating of the electrical performance parameters further comprises using a shape related model.

6. The method of claim 5, wherein the data refinement table comprises various electrical parameters associated with the shape related model.

7. A method, comprising:
deriving equivalent dimensions of an integrated circuit (IC) device based on its design layout;
generating a data refinement table;
obtaining electrical performance parameters of the IC device based on the equivalent dimensions and the data refinement table; and
thereafter adjusting the design layout of the IC device based on the electrical performance parameters;
wherein the deriving, the generating, the obtaining, and the adjusting are each carried out using a computer hardware device encoded with software instructions.

8. The method of claim 7, wherein the deriving the equivalent dimensions includes:
generating a contour of the IC device through simulation; and
computing the equivalent dimensions based on the IC contour.

9. The method of claim 8, wherein the generating the contour includes defining a channel contour.

10. The method of claim 9, wherein the generating the contour includes generating an active region contour and a gate electrode contour, and wherein the channel contour is defined by an overlapping portion of the active region contour and the gate electrode contour.

11. The method of claim 10, wherein the overlapping region has a rectangular shape that includes a width and a length, and wherein the computing the equivalent dimensions is carried out using the width and the length.

12. The method of claim 7, wherein the obtaining the electrical performance parameters is carried out using a shape related model.

13. The method of claim 12, further including predicting actual electrical performance of the IC device based on the shape related model.

14. The method of claim 12, wherein the generating the data refinement table is carried out in a manner so that the data refinement table includes electrical parameters that are associated with the shape related model.

15. An apparatus comprising a non-transitory, tangible computer readable storage medium storing a computer program, wherein the computer program has instructions that when executed, carry out:
deriving equivalent dimensions of an integrated circuit (IC) device based on its design layout;
generating a data refinement table;
obtaining electrical performance parameters of the IC device based on the equivalent dimensions and the data refinement table; and
thereafter adjusting the design layout of the IC device based on the electrical performance parameters.

16. The apparatus of claim 15, wherein the instructions for deriving the equivalent dimensions include instructions for:
generating a contour of the IC device through simulation; and
computing the equivalent dimensions based on the IC contour.

17. The apparatus of claim 16, wherein the instructions for generating the contour include instructions for:
generating an active region contour and a gate electrode contour; and
defining an overlapping portion of the active region contour and the gate electrode contour as a channel contour.

18. The apparatus of claim 15, wherein the instruction for obtaining the electrical performance parameters include instructions for using a shape related model.

19. The apparatus of claim 18, wherein the computer program further includes instructions for predicting actual electrical performance of the IC device based on the shape related model.

20. The apparatus of claim 18, wherein the instructions for generating the data refinement table include instructions that associate electrical parameters of the data refinement table with the shape related model.

* * * * *